United States Patent
Ishihara

(10) Patent No.: US 7,983,058 B2
(45) Date of Patent: Jul. 19, 2011

(54) SHIELDING STRUCTURE AND MEMBER FOR ELECTRONIC DEVICE AND ELECTRONIC DEVICE INCLUDING THE SAME

(75) Inventor: Takeshi Ishihara, Tokyo (JP)

(73) Assignee: NEC Corporation, Tokyo (JP)

( * ) Notice: Subject to any disclaimer, the term of this patent is extended or adjusted under 35 U.S.C. 154(b) by 70 days.

(21) Appl. No.: 12/524,944

(22) PCT Filed: Jan. 22, 2008

(86) PCT No.: PCT/JP2008/050736
§ 371 (c)(1),
(2), (4) Date: Jul. 29, 2009

(87) PCT Pub. No.: WO2008/093559
PCT Pub. Date: Aug. 7, 2008

(65) Prior Publication Data
US 2010/0144410 A1 Jun. 10, 2010

(30) Foreign Application Priority Data
Jan. 29, 2007 (JP) ................... 2007-017534

(51) Int. Cl.
*H05K 9/00* (2006.01)
(52) U.S. Cl. ........ 361/816; 361/800; 361/818; 174/350; 174/351; 174/354
(58) Field of Classification Search ............... 361/818, 361/753, 799, 800, 816; 174/350, 351, 354, 174/358, 362, 366, 371, 374, 377, 387
See application file for complete search history.

(56) References Cited

U.S. PATENT DOCUMENTS

| | | | |
|---|---|---|---|
| 5,436,802 A * | 7/1995 | Trahan et al. | 361/816 |
| 5,495,399 A | 2/1996 | Gore et al. | |
| 6,181,573 B1 * | 1/2001 | Riet | 361/816 |
| 6,552,261 B2 * | 4/2003 | Shlahtichman et al. | 174/384 |
| 7,317,618 B2 * | 1/2008 | Robinson et al. | 361/719 |
| 7,488,902 B2 * | 2/2009 | English et al. | 174/382 |

(Continued)

FOREIGN PATENT DOCUMENTS
EP 0926940 A1 6/1999
(Continued)

OTHER PUBLICATIONS

International Search Report for PCT/JP2008/050736 mailed Feb. 26, 2008.

(Continued)

*Primary Examiner* — Dameon E Levi

(57) ABSTRACT

Shielding structure for use in an electronic device comprising a housing and an electronic substrate which is arranged in the housing and which includes electronic parts, wherein the housing includes at least a surface facing the electronic parts, the surface being made of an electrically conductive substance. There is disposed a shielding member made of electrically conductive material comprising a frame-shaped section disposed on the printed board to surround a periphery of the electronic parts and a leaf spring section disposed to project from an upper-edge section of the frame-shaped section toward the inside of the frame-shaped section and upwardly in an inclined direction. The shielding member is disposed on the electronic substrate, and the surface made of an electrically conductive substance of the housing pushes the leaf spring section to be brought into contact therewith.

9 Claims, 3 Drawing Sheets

U.S. PATENT DOCUMENTS

2002/0003695 A1 * 1/2002 Spratte et al. ................ 361/818

FOREIGN PATENT DOCUMENTS

| JP | 4-121796 A | 10/1992 |
|---|---|---|
| JP | 8-070195 A | 3/1996 |
| JP | 8-288687 A | 11/1996 |
| JP | 2002190690 A | 7/2002 |
| JP | 2006344814 A | 12/2006 |

OTHER PUBLICATIONS

Supplementary European Search Report for EP 08 70 3586 completed Apr. 16, 2010.

* cited by examiner

SHIELDING STRUCTURE AND MEMBER FOR ELECTRONIC DEVICE AND ELECTRONIC DEVICE INCLUDING THE SAME

This application is the National Phase of PCT/JP2008/050736 filed on Jan. 22, 2008, which is based upon and claims priority to Japanese patent application No. 2007-017534, filed on Jan. 29, 2007, the disclosure of which is incorporated herein in its entirety by reference.

TECHNICAL FIELD

The present invention relates to shielding structure, a shielding member, and primarily a small-sized electronic device including the same.

RELATED ART

Conventionally, for an electronic device, there exists a situation wherein it is required to secure a sufficient Electro Magnetic Compatibility (EMC) characteristic and a sufficient Electro Static Discharge (ESD) characteristic by suppressing radiation noise from electronic parts included in the electronic device to external devices and conversely by suppressing noise and influence of electrostatic discharge from external devices to the electronic device.

To secure a sufficient EMC characteristic and a sufficient ESD characteristic, shielding structure is effective means.

FIG. 1 is a perspective view showing shielding structure of a first conventional example and FIG. 2 is a front cross-sectional view along line A-A of FIG. 1. Incidentally, FIG. 2 does not show a housing 103 of an electronic device.

As FIG. 2 shows, electronic parts 102 are disposed on a printed board 101 of the electronic device.

As FIGS. 2 and 1 show, the shielding structure of the first conventional example is constructed by mounting, in an inside of the housing 103 of the electronic device, a box-shaped shielding member 104 surrounding the electronic parts 102 onto the printed board 101.

Next, FIG. 2 is a perspective view showing shielding structure of a second conventional example and FIG. 4 is a front cross-sectional view along line A-A of FIG. 3. Incidentally, FIG. 4 does not show a housing 103 of an electronic device.

As FIGS. 4 and 3 show, the shielding structure of the second conventional example is constructed by mounting, in an inside of the housing 103 of the electronic device, a box-shaped shielding member 105 surrounding the electronic parts 102 onto the printed board 101 and by further arranging a metallic lid-shaped shielding member 106 to cover the box-shaped shielding member 105.

In addition, Patent Document 1 is a conventional technical document associated with the shielding structure of electronic devices.

Patent Document 1 discloses shielding structure, i.e., in shielding structure comprising a printed board, a thin-film metallic shielding case mounted on the printed board, a metallic case to accommodate the printed board and the shielding case, and a metallic cover; the shielding case has a frame form and an edge on an upper-end periphery in which a plurality of grooves are disposed with an arbitrary interval therebetween in a spring form; when the printed board is engaged with the metallic case and then the metallic cover is mounted thereon, the edge and the cover push each other to be brought into contact with each other, and shielding effect is attained.

Patent Document 1: Japanese Unexamined Utility Model (Registration) Application Publication. No. Hei 4-121796

DISCLOSURE OF THE INVENTION

Problem to be Solved by the Invention

However, in the structure of the first conventional example (FIGS. 1 and 2), it is required to secure the thickness of a top plate of the shielding member 104, a clearance C101 between the top plate of the shielding member 104 and the electronic parts 4 (FIG. 2), and a clearance C102 between the top plate of the shielding member 104 and the housing 103 (FIG. 2); it is hence difficult to reduce the thickness of the electronic device.

Similarly, in the structure of the second conventional example (FIGS. 3 and 4), it is required to secure the thickness of a top plate of the box-shaped shielding member 105 and that of a top plate of the lid-shaped shielding member 106, a clearance C103 between the top plate of the box-shaped shielding member 105 and the electronic parts 4 (FIG. 4), and a clearance C104 between the top plate of the lid-shaped shielding member 106 and the housing 103 (FIG. 4); it is accordingly difficult to reduce the thickness of the electronic device.

Further, in the technique of Patent Document 1, since the spring-shaped edge is bent in a direction from the lid-shaped shielding case toward the outside, there exists a problem that the electronic device is increased in size in the plan view.

Additionally, according to the technique of Patent Document 1, the lid-type shielding case does not include a location (adsorbing space) which can be adsorbed by an automatic mounting machine; it is hence difficult to mount the lid-shaped shielding case onto the printed board by the automatic mounting machine, leading to a problem that the production of the electronic device requires much time and labor.

Moreover, in Patent Document 1, description has not been given of reduction in the thickness of the electronic device.

The present invention has been devised to solve the problem described above and aims to provide a shielding structure of an electronic device, a shielding member thereof, and an electronic device including the shielding structure, wherein the shielding structure can suppress radiation noise for an electronic device and is resistive against external noise and electrostatic discharge, has a sufficient Electro Magnetic Compatibility (EMC) characteristic and an sufficient Electro Static Discharge (ESD) characteristic, and can also reduce the thickness of the electronic device without increasing its size in the plan view.

Means for Solving the Problem

To solve the problem, shielding structure of an electronic device of the present invention includes a housing and an electronic substrate which is arranged in the housing and which includes electronic parts, wherein the housing includes at least a surface facing the electronic parts on the electronic substrate, the surface being made of an electrically conductive substance, characterized in that a shielding member made of electrically conductive material including a frame-shaped section disposed on the electronic substrate to surround a periphery of the electronic parts and a leaf spring section disposed to project from an upper-edge section of the frame-shaped section toward the inside of the frame-shaped section and upwardly in an inclined direction is disposed on the electronic substrate, and the surface made of an electrically conductive substance of the housing pushes the leaf spring section to be brought into contact with the leaf spring section.

In the shielding structure of the electronic device of the present invention, it is favorable that the shielding member is fixed onto the upper-edge section of the frame-shaped section to locate in an area inside the frame-shaped section and includes an adsorbed section which is adsorbed by an automatic mounting machine when the shielding member is mounted onto the electronic substrate.

In the shielding structure of the electronic device of the present invention, the adsorbed section is favorably installed between two points of the upper-edge section of the frame-shaped section.

In the shielding structure of the electronic device of the present invention, it is favorable that at least a lower-edge section of a base section of the leaf spring section is placed to be lower than upper edges of the electronic parts and the leaf spring section has a contour and dimensions such that even in a state in which the inner peripheral surface made of an electrically conductive substance of the housing pushes the leaf spring section, the leaf spring section does not come into contact with the electronic parts.

In the shielding structure of the electronic device of the present invention, it is favorable that at least the lower-edge section of the base section of the leaf spring section is placed to be lower than the upper edges of the electronic parts, at least a lower edge of the adsorbed section is located to be lower than the upper edges of the electronic parts, and the leaf spring section has a contour and dimensions such that even in a state in which the inner peripheral surface made of an electrically conductive substance of the housing pushes the leaf spring section, the leaf spring section does not come into contact with the electronic parts.

In the shielding structure of the electronic device of the present invention, it is favorable that at least a surface of the housing which faces the electronic parts on the electronic substrate and the shielding member are respectively made of metallic material.

It is characterized that the shielding member of the present invention is the shielding member in the shielding structure of the present invention.

Also, the electronic device of the present invention is characterized by including the shielding structure of the present invention.

Favorable examples of the electronic device of the present invention are, for example, a mobile telephone or other mobile electronic devices.

Advantages of the Invention

In accordance with the present invention, the shielding includes an electrically conductive material employed for a housing of an electronic device, a shielding member with a leaf spring, and a printed board; therefore, even if the thickness of the top plate of the shielding member and the thickness corresponding to the clearance of the conventional shielding structure are reduced, a sufficient shielding advantage can be obtained; therefore, it is possible to implement a thin electronic device having a sufficient EMC characteristic and a sufficient ESD characteristic.

Also, since the leaf spring section is arranged to project inwardly from the frame-shaped section of the shielding member, the shielding member is reduced in size in the plan view, and it is accordingly possible to avoid the enlargement in size of the electronic device in the plan view. That is, without enlarging the size in the plan view of the electronic device, the thickness of the electronic device can be reduced with the sufficient shielding function kept unchanged.

Best Mode for Carrying Out the Invention

Next, description will be given of an exemplary embodiment of carrying out the present invention by referring to drawings.

Recently, since electronic devices have been reduced in size and thickness, metal is increasingly employed for the housing to secure structural strength of the electronic devices.

As described hereinbelow, in the present embodiment, metal adopted for the housing is employed as part of the shielding structure; hence, the thickness can be reduced when compared with the conventional art.

FIG. 5 is a perspective view showing shielding structure in accordance with the present embodiment and FIG. 6 is a front cross-sectional view of the shielding structure along line A-A of FIG. 5. Incidentally, FIG. 5 does not show a housing 2 (which will be described later).

As shown in FIG. 6, the shielding structure in accordance with the present embodiment includes a housing 2 of an electronic device (an overall electronic device is not shown), a printed board 1 arranged in the housing 2, and a shielding member 3 disposed on the printed board 1.

A plurality of electronic parts 4 are disposed on the printed board 1.

The housing 2 of the electronic device is made of, for example, a metallic material and is hence electrically conductive.

The shielding member 3 is also made of, for example, a metallic material and is electrically conductive.

The shielding member 3 includes a frame-shaped section 5 disposed on the printed board 1 to surround a periphery of, for example, the plurality of electronic parts 4, a leaf spring section 6 disposed to project from an upper-edge section of the frame-shaped section 5 toward the inside of the frame-shaped section 5 and upwardly in an inclined direction, and an adsorbed section 7 which is fixed onto an upper-edge section of the frame-shaped section 5 to locate in an area inside the frame-shaped section 5 and which is adsorbed by an automatic mounting machine (not shown) when the shielding member 3 is mounted onto the printed board 1.

The frame-shaped section 5 includes, for example, a rising-wall-shaped section 8 disposed on the printed board 1 to rise therefrom and a projecting section 9 which projects from an upper edge section of the rising-wall-shaped section 8 toward the inside in the form of a picture frame.

The frame-shaped section 5 is formed, for example, in the overall shape of the rectangular frame as shown in FIG. 5.

The leaf spring section 6 includes, as its base section, an inner peripheral edge of the projecting section 9 of the frame-shaped section 5, and is disposed to project from the base section toward the inside of the frame-shaped section 5 and upwardly in an inclined direction.

The leaf spring section 6 is formed, for example, in a rectangular shape as shown in FIG. 5.

Meanwhile, in FIG. 5, the leaf spring section 6 is disposed as an example at each of four inner peripheral sides of the frame-shaped section 5; however, there may be used an arbitrary number of leaf spring sections 6.

The adsorbed section 7 is installed between two points of the projecting section 9 of the frame-shaped section 5. That is, the adsorbed section 7 is supported by a pair of beam-shaped sections 10 arranged from two points of the projecting section 9 to respectively extend toward the inside of the frame-shaped section 5.

As FIG. 5 shows, it is favorable that the beam-shaped sections 10 in pair are disposed, for example, respectively on the mutually opposing inner peripheral edges of the projecting section 9.

Incidentally, the adsorbed section 7 and the beam-shaped sections 10 are beforehand designed to be arranged at position where they do not interfere with the electronic parts 4.

It is favorable that the shielding member 3 of such configuration is formed integrally as one unit by conducting sheet metal working on a metallic plate.

Since the shielding member 3 is configured as above, there does not exist the top plate in the upper edge section of the shielding member 3 as shown in FIGS. 5 and 6; in the upper edge section of the shielding member 3, the locations other than the projecting section 9, the leaf spring section 6, the beam-shaped section 10, and the adsorbed section 7 are (for example, two) openings 11.

The shielding member 3 constructed as above is disposed on the printed board 1 as shown in FIGS. 5 and 6; and, for example, the plurality of electronic parts 4 are surrounded by the frame-shaped section 5 of the shielding member 3.

Meanwhile, the lower edge section of the frame-shaped section 5 is fixedly soldered onto the printed board 1, and at least part of the lower edge section of the frame-shaped section 5 is electrically connected to a ground potential section (not shown) of the printed board 1.

Further, the housing 2 is arranged such that its inner peripheral surface pushes the leaf spring section 6 of the shielding member 3, and a tip end of the leaf spring section 6 is electrically linked with the inner peripheral surface of the housing 2.

In this situation, as shown in FIG. 6, at least the lower edge of the base section of the leaf spring section 6 is placed to be lower than the upper edges of the electronic parts 4.

Also, at least the lower edge of the adsorbed section 7 is located to be lower than the upper edges of the electronic parts 4.

However, the leaf spring section 6 has a contour (projecting angle) and dimensions such that even in a state wherein the inner peripheral surface of the housing 2 pushes the leaf spring section 6 and the leaf spring section 6 is elastically deformed toward the lower side, the leaf spring section 6 does not come into contact with the electronic parts 4.

Next, operation will be described.

As FIG. 6 shows, in an assembled state of the shielding structure, the shielding includes the housing 2, the shielding member 3, and the printed board 1, which can prevent noise radiated from the electric parts 4 surrounded by these three constituent elements from propagating through the housing 2 into the outside and which can prevent external noise and static electricity from entering the housing 2.

In accordance with the above exemplary embodiment, the shielding structure includes the housing 2, the shielding member 3 including the leaf spring section 6, and the printed board 1; hence, there is obtained an electronic device which can suppress radiation noise and is resistive against external noise and electrostatic discharge and which has a sufficient Electro Magnetic Compatibility (EMC) characteristic and an sufficient Electro Static Discharge (ESD) characteristic. Moreover, the housing 2 is employed as the top plate of the shielding structure; hence, when compared with the conventional shielding structure, sufficient shielding effect can be attained even if the clearance C between the electronic parts 4 and the housing 2 is reduced, and it is possible to reduce the thickness of the electronic device.

Additionally, since the leaf spring 6 of the shielding member 3 can be formed by sheet metal working, the cost is the same as for the conventional device.

Further, the leaf spring section 6 is disposed to project toward the inside of the frame-shaped section 5; hence, it is possible to suppress the size in the plan view of the shielding member 3 to prevent the increase in size of the electronic device in the plan view.

Also, the shielding member 3 includes the adsorbed section 7 to be adsorbed by the automatic mounting machine when the shielding member 3 is mounted onto the printed board 1; hence, the shielding member 3 can be appropriately and automatically mounted onto the printed board 1 and the production of the electronic device is facilitated.

Moreover, at least the lower edge of the base section of the leaf spring section 6 of the shielding member 3 is placed to be lower than the upper edges of the electronic parts 4 and at least the lower edge of the adsorbed section 7 is arranged to be lower than the upper edges of the electronic parts 4; therefore, the electronic parts 4 and the locations of the shielding member 3 not positionally interfering with the electronic parts 4 (at least the lower edge of the base section of the leaf spring section 6 and at least the lower edge of the adsorbed section 7 of the shielding member 3) are disposed to mutually overlap with each other in the direction of the thickness of the electronic device, which makes it possible to further reduce the thickness of the electronic device.

In addition, the leaf spring section 6 has the contour and dimensions such that even in a state in which the inner peripheral surface of the housing 2 pushes the leaf spring section 6 and the leaf spring section 6 is elastically deformed toward the lower side, the leaf spring section 6 does not come into contact with the electronic parts 4; hence, there does not appear a disadvantage in which the leaf spring section 6 comes into contact with the electronic parts 4 in an assembled state of the shielding structure.

Meanwhile, the electronic device in the above exemplary embodiment is favorably, for example, a mobile-type electronic device. The mobile-type electronic devices include, for example, mobile telephones (FOMA, PDC, CDMA, and GSM) as well as PDA and PHS.

Further, for the above exemplary embodiment, description has been given of an example of a metallic housing 2; however, it is only necessary that at least a surface of the housing which faces the electronic parts 4 on the printed board 1 is made of an electrically conductive substance; for example, there may be employed a housing in which a metal is evaporated onto the inner peripheral surface of the main body of the housing made of a nonmetallic substance (ABS or the like) or in which a metallic plate is formed onto the inner peripheral surface by an in mold process.

Further, for the above exemplary embodiment, description has been given of an example in which the shielding member 3 is made of a metal; however, the shielding member 3 may also be made of an elastic, electrically conductive substance other than metal.

DESCRIPTION OF REFERENCE NUMERALS

Figure 1:
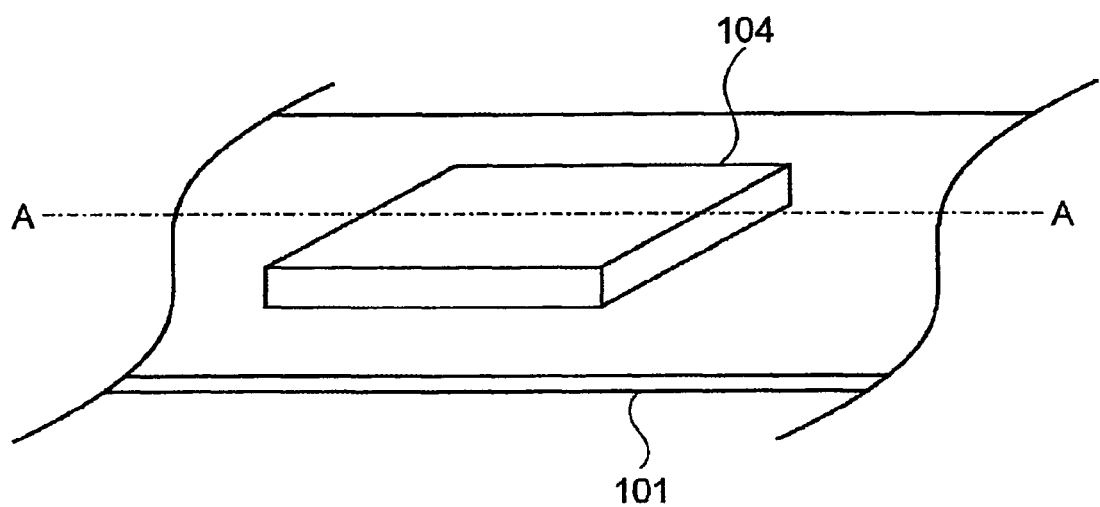
FIG. 1 is a perspective view showing shielding structure of a first conventional example.
Figure 2:
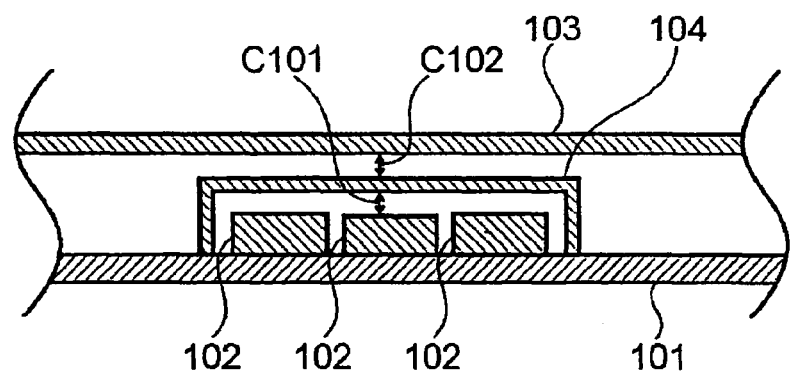
FIG. 2 is a front cross-sectional view of the shielding structure along line A-A of FIG. 1.
Figure 3:
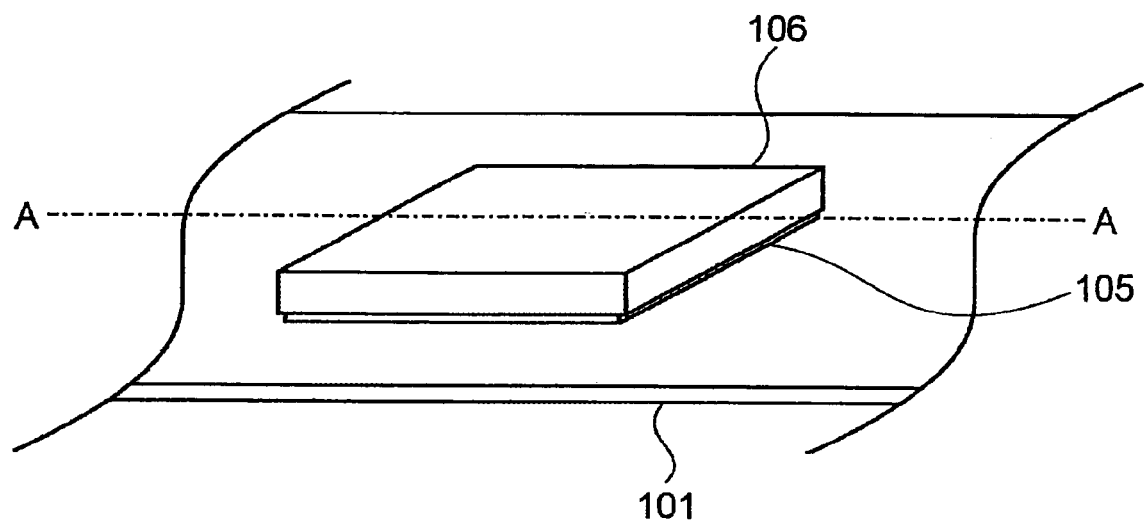
FIG. 3 is a perspective view showing shielding structure of a second conventional example.
Figure 4:
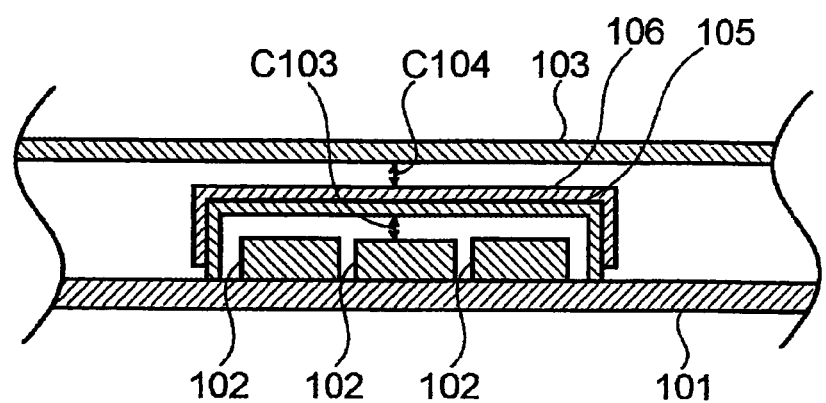
FIG. 4 is a front cross-sectional view of the shielding structure along line A-A of FIG. 3.
Figure 5:
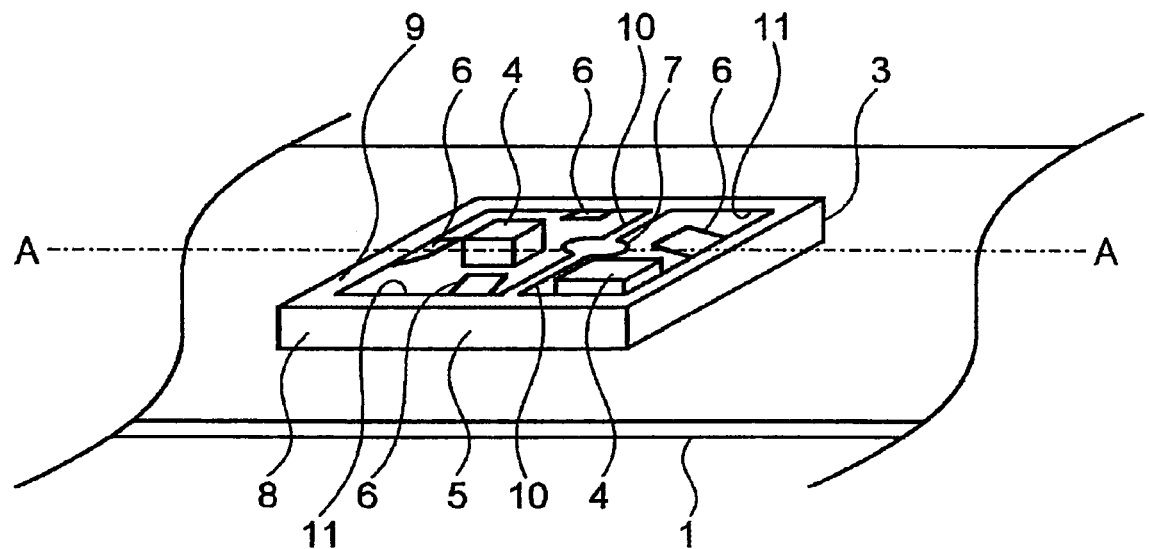
FIG. 5 is a perspective view showing shielding structure in accordance with an exemplary embodiment of the present invention.
Figure 6:
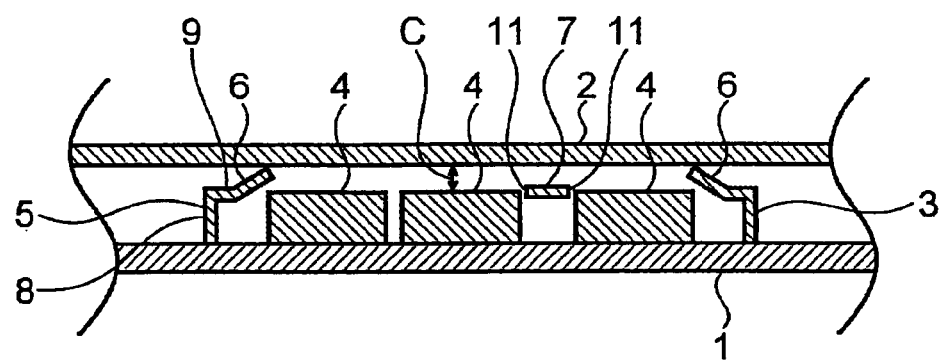
FIG. 6 is a front cross-sectional view of the shielding structure along line A-A of FIG. 5.

1 Printed board
2 Housing
3 Shielding member
4 Electronic part
5 Frame-shaped section
6 Leaf spring section
7 Adsorbed section

The invention claimed is:

1. Shielding structure for use in an electronic device comprising a housing and an electronic substrate which is arranged in the housing and which includes electronic parts, wherein the housing includes at least a surface facing the electronic parts on the electronic substrate, the surface being made of an electrically conductive substance, the shielding structure comprising:
 a shielding member made of electrically conductive material comprising: (a) a frame-shaped section disposed on the electronic substrate to surround a periphery of the electronic parts, and (b) a leaf spring section comprising a base section coupled to an upper edge section of the frame-shaped section, the leaf spring section projecting from the base section toward the inside of the frame-shaped section and upwardly in an inclined direction;
 wherein:
 the surface pushes the leaf spring section to be brought into contact with the leaf spring section;
 the base section includes a lower edge section which is lower than upper edges of the electronic parts; and
 the leaf spring section has a contour and dimensions such that even in a state in which the surface pushes the leaf spring section, the leaf spring section does not come into contact with the electronic parts.

2. The shielding structure of the electronic device in accordance with claim 1, characterized in that the shielding member is fixed onto the upper-edge section of the frame-shaped section to locate in an area inside the frame-shaped section and includes an adsorbed section which is adsorbed by an automatic mounting machine when the shielding member is mounted onto the electric substrate.

3. The shielding structure of the electronic device in accordance with claim 2, characterized in that the adsorbed section is installed between two points of the upper-edge section of the frame-shaped section.

4. The shielding structure of the electronic device in accordance with claim 2, characterized in that at least the lower-edge section of a base section of the leaf spring section is placed to be lower than the upper edges of the electronic parts, at least a lower edge of the adsorbed section is located to be lower than the upper edges of the electronic parts, and the leaf spring section has a contour and dimensions such that even in a state in which the inner peripheral surface made of an electrically conductive substance of the housing pushes the leaf spring section, the leaf spring section does not come into contact with the electronic parts.

5. The shielding structure of the electronic device in accordance with claim 1, characterized in that at least a surface of the housing which faces the electronic parts on the electronic substrate and the shielding member are respectively made of metallic material.

6. An electronic device comprising the shielding structure of claim 1.

7. The electronic device in accordance with claim 6, characterized in that the electronic device is a mobile electronic device.

8. The electronic device in accordance with claim 7, characterized in that the electronic device is a mobile telephone.

9. A shielding member for use with a shielding structure for use in an electronic device, the shielding structure comprising a housing and an electronic substrate which is arranged in the housing and which includes electronic parts, wherein the housing includes at least a surface facing the electronic parts on the electronic substrate, the surface being made of an electrically conductive substance, the shielding structure comprising:
 a shielding member made of electrically conductive material comprising: (a) a frame-shaped section disposed on the electronic substrate to surround a periphery of the electronic parts, and (b) a leaf spring section comprising a base section coupled to an upper edge section of the frame-shaped section, the leaf spring section projecting from the base section toward the inside of the frame-shaped section and upwardly in an inclined direction;
 wherein:
 the surface pushes the leaf spring section to be brought into contact with the leaf spring section;
 the base section includes a lower edge section which is lower than upper edges of the electronic parts; and
 the leaf spring section has a contour and dimensions such that even in a state in which the surface pushes the leaf spring section, the leaf spring section does not come into contact with the electronic parts.

* * * * *